United States Patent
Kang et al.

(10) Patent No.: US 7,585,734 B2
(45) Date of Patent: Sep. 8, 2009

(54) METHOD OF FABRICATING MULTI-GATE TRANSISTOR AND MULTI-GATE TRANSISTOR FABRICATED THEREBY

(75) Inventors: Tae-Woong Kang, Suwon-si (KR); Jong-hyon Ahn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/074,580

(22) Filed: Mar. 5, 2008

(65) Prior Publication Data

US 2008/0160684 A1 Jul. 3, 2008

Related U.S. Application Data

(62) Division of application No. 11/103,115, filed on Apr. 11, 2005, now abandoned.

(30) Foreign Application Priority Data

Jun. 29, 2004 (KR) .................. 10-2004-0049663

(51) Int. Cl.
*H01L 21/336* (2006.01)

(52) U.S. Cl. .............. 438/283; 438/164; 438/595; 438/696; 257/E21.618; 257/E21.621; 257/E21.626

(58) Field of Classification Search ......... 438/156–157, 438/164, 184, 197, 230–232, 303, 365–366, 438/595, 696, 283, 301, 305–306, 514, 527, 438/288, 149, 151; 257/328, 369, 347, 408, 257/412, 623, E21.618, E21.619, E21.621, 257/E21.623, E21.626, E21.633–21.635, 257/E21.64, E21.637, E29.028

See application file for complete search history.

(56) References Cited

U.S. PATENT DOCUMENTS

| | | | | |
|---|---|---|---|---|
| 4,892,753 A | * | 1/1990 | Wang et al. ............ | 427/579 |
| 6,413,802 B1 | * | 7/2002 | Hu et al. .................. | 438/151 |
| 6,703,672 B1 | * | 3/2004 | Brigham et al. .......... | 257/407 |
| 6,716,690 B1 | * | 4/2004 | Wang et al. .............. | 438/197 |
| 6,756,643 B1 | * | 6/2004 | Achuthan et al. ........ | 257/365 |
| 6,787,476 B1 | * | 9/2004 | Dakshina-Murthy et al. | 438/740 |
| 6,815,268 B1 | * | 11/2004 | Yu et al. ................... | 438/149 |

(Continued)

FOREIGN PATENT DOCUMENTS

JP 9-23011 1/1997

OTHER PUBLICATIONS

Suzuki, Kunihiro, et al. "Scaling Theory for Double-Gate SOI MOSFET's," IEEE Transactions on Electron Devices, vol. 40, No. 12, Dec. 1993, p. 2326-2329.

(Continued)

*Primary Examiner*—Matthew C Landau
*Assistant Examiner*—Joseph C Nicely
(74) *Attorney, Agent, or Firm*—Mills & Onello, LLP.

(57) ABSTRACT

Provided are a method of fabricating an improved multi-gate transistor and a multi-gate transistor fabricated using the method, in which an active pattern is formed on a substrate, the active pattern having two or more surfaces on which channel regions are to be formed, a gate insulating layer is formed on the channel regions, and a patterned gate electrode is formed on the gate insulating layer while maintaining a shape conformal to the active pattern.

14 Claims, 7 Drawing Sheets

U.S. PATENT DOCUMENTS

| | | | |
|---|---|---|---|
| 6,943,085 B2 * | 9/2005 | Wang et al. | 438/305 |
| 6,982,464 B2 * | 1/2006 | Achuthan et al. | 257/368 |
| 6,992,354 B2 * | 1/2006 | Nowak et al. | 257/347 |
| 7,005,330 B2 * | 2/2006 | Yeo et al. | 438/157 |
| 7,091,068 B1 * | 8/2006 | Ahmed et al. | 438/149 |
| 7,166,516 B2 * | 1/2007 | Furuhashi et al. | 438/301 |
| 7,276,763 B2 * | 10/2007 | Yeo et al. | 257/328 |
| 7,282,766 B2 * | 10/2007 | Okuno | 257/347 |
| 7,329,913 B2 * | 2/2008 | Brask et al. | 257/287 |
| 7,361,958 B2 * | 4/2008 | Brask et al. | 257/369 |
| 7,442,596 B2 * | 10/2008 | Lee et al. | 438/198 |
| 2002/0142530 A1 * | 10/2002 | Hu et al. | 438/182 |
| 2003/0102518 A1 * | 6/2003 | Fried et al. | 257/401 |
| 2003/0178677 A1 * | 9/2003 | Clark et al. | 257/347 |
| 2003/0227036 A1 | 12/2003 | Sugiyama et al. | |
| 2004/0036127 A1 | 2/2004 | Chau et al. | |
| 2004/0075122 A1 | 4/2004 | Lin et al. | |
| 2004/0124450 A1 * | 7/2004 | Yeap et al. | 257/288 |
| 2004/0126975 A1 * | 7/2004 | Ahmed et al. | 438/283 |
| 2004/0235300 A1 * | 11/2004 | Mathew et al. | 438/689 |
| 2005/0121733 A1 | 6/2005 | Chen et al. | |
| 2005/0156171 A1 * | 7/2005 | Brask et al. | 257/72 |
| 2005/0224800 A1 | 10/2005 | Lindert et al. | |
| 2005/0272213 A1 * | 12/2005 | Wang et al. | 438/303 |
| 2007/0158703 A1 * | 7/2007 | Mathew et al. | 257/288 |
| 2009/0061572 A1 * | 3/2009 | Hareland et al. | 438/157 |

OTHER PUBLICATIONS

Chau, Robert S., et al. "Advanced Depleted-Substrate Transistors: Single-gate, Double-gate and Tri-gate," (Invited Paper), Extended Abstracts of the International Conference on Solid State Devices and Materials (SSDM), Nagoya, Japan, 2002, p. 68-69.

Krivokapic, Z., et al. "High Performance 45nm CMOS Technology with 20nm Multi-Gate Devices," Extended Abstracts of the 2003 International Conference on Solid State Devices and Materials (SSDM), Tokyo, Japan, 2003.

Yang, Jeong-Hwan, et al. "Fully Working 1.25um^2 6T-STRAM Cell with 45nm Gate Length Triple Gate Transistors," Electron Devices Meeting, 2003, IEDM 2003 Technical Digest, IEEE International, Dec. 8-10, 2003, p. 2.1.1-2.1.4.

* cited by examiner

METHOD OF FABRICATING MULTI-GATE TRANSISTOR AND MULTI-GATE TRANSISTOR FABRICATED THEREBY

This application is a divisional of U.S. application Ser. No. 11/103,115, filed Apr. 11, 2005, which claims priority from Korean Patent Application No. 10-2004-0049663 filed on Jun. 29, 2004 in the Korean Intellectual Property Office, the contents of which are incorporated herein by reference in their entirety.

BACKGROUND OF THE INVENTION

1. Field of the Invention

The present invention relates to a multi-gate transistor having a gate electrode with improved performance and a fabrication method thereof.

2. Description of the Related Art

Multi-gate transistors having a double-gate structure or a tri-gate structure have been developed for next-generation devices. These devices overcome degradation of performance due to a reduction of gate length (Lg) accompanied with scale down in devices (Kunihiro Suzuki et al., IEEE 1993 "Scaling Theory for Double-Gate SOI MOSFETs"; Robert Chau, SSDM 2002, "Advanced Depleted-Substrate Transistors: Single-Gate, Double-Gate and Tri-Gate"; Z. Krivokapic, SSDM 2003, "High Performance 45 nm CMOS Technology with 20 nm Multi-Gate Devices"; Jeong-Hwan Yang, IEDM 2003, "Fully Working 6T-SRAM Cell with 45 nm Gate Length Triple Gate Transistors").

A multi-gate transistor having a double-gate or tri-gate structure has a higher tolerance on the thickness (Tsi) of a fully depleted region compared with a single-gate transistor.

Such a general multi-gate transistor structure includes an active pattern formed by patterning a single crystalline silicon body on an insulating layer of a silicon-on-insulator (SOI) wafer and a gate electrode formed on a side and/or an upper surface of the active pattern.

To fabricate a conventional multi-gate transistor an active pattern is formed by patterning a silicon body formed on an insulating layer. Polysilicon for forming a gate electrode is deposited on a lateral surface and/or an upper surface of the active pattern. Here, the underlying active pattern makes the entire surface of polysilicon deposited uneven. Thus, it is quite difficult to perform a photolithography process for forming the gate electrode. To solve this problem, a planarizing process using chemical mechanical polishing (CMP) is additionally performed after depositing a thick layer of polysilicon.

However, in depositing the polysilicon, the thickness of polysilicon deposited is not uniform, resulting in a deviation in the thickness of polysilicon deposited throughout the surface. In the CMP process based on time control, a deviation in the thickness of polysilicon polished throughout the surface may also be generated. The deviation in the thickness of polysilicon makes it difficult to control the thickness of the gate electrode. For example, when it is intended to deposit polysilicon to a thickness of several hundreds to several thousands of Angstroms, use of conventional CMP may cause a thickness deviation of several hundred angstroms across the surface of deposited polysilicon. Thus, it is difficult to control the thickness of a gate electrode structure, ultimately resulting in a degradation of electrical characteristics of the transistor.

SUMMARY OF THE INVENTION

The present invention provides a method of fabricating a multi-gate transistor having improved performance, in which a profile of a gate electrode formed on a gate insulating layer of the multi-gate transistor can be controlled in a stable manner.

The present invention also provides a multi-gate transistor fabricated by the method.

According to an aspect of the present invention, there is provided a method of fabricating a multi-gate transistor including forming an active pattern on a substrate, the active pattern having two or more surfaces on which channel regions are to be formed, forming a gate insulating layer on the channel regions, and forming a patterned gate electrode on the gate insulating layer while maintaining a shape conformal to the active pattern.

In one embodiment, forming the patterned gate electrode comprises: forming a conductive layer for a gate electrode on the gate insulating layer conformally to the active pattern; forming a sacrificial layer for planarizing an upper surface of the substrate by filling a step of the conformally formed conductive layer for the gate electrode; and forming the gate electrode by patterning the conductive layer and the sacrificial layer.

In one embodiment, forming the sacrificial layer comprises: forming the sacrificial layer on the entire surface of the resulting structure having the conductive layer; and filling the step of the conformally formed conductive layer by planarizing the sacrificial layer.

In one embodiment, the sacrificial layer is an amorphous silicon layer.

Planarizing the sacrificial layer can include using a chemical mechanical polishing (CMP) process. In one embodiment, a polishing stop layer is formed on the conductive layer after the conductive layer is formed. The polishing stop layer can be formed of a material selected from the group consisting of $SiO_2$, SiN, SiON, and a combination thereof.

In one embodiment, before the patterning of the conductive layer and the sacrificial layer, an insulating layer is formed on the substrate, a hard mask is formed by patterning the insulating layer using a pattern for defining the gate electrode, and the gate electrode is formed by etching the conductive layer and the sacrificial layer using the hard mask as an etch mask.

In one embodiment, after forming the gate electrode, the remaining sacrificial layer is removed. In one embodiment, the remaining sacrificial layer is removed by a selective wet etching process. In one embodiment, a tetramethylammonium hydroxide (TMAH) solution, or a mixed solution of nitric acid, HF and water, is used during the selective wet etching process.

In one embodiment, before the removing of the sacrificial layer, a first spacer is formed on the gate electrode and the lateral surfaces of the sacrificial layer remaining on the gate electrode, wherein in the removing of the sacrificial layer, the first spacer formed on the lateral surface of the sacrificial layer is removed together with the sacrificial layer so that the first spacer remains on the lateral surfaces of the gate electrode. The first spacer can be formed at a temperature of 550 degrees C. or less. The first spacer can be formed of a material selected from the group consisting of $SiO_2$, SiN, SiON, and a combination thereof.

In one embodiment, after removing the sacrificial layer, shallow low-concentration ion implantation is performed by implanting ions into the active pattern using the gate electrode and the first spacer as ion-implantation masks; a second spacer is formed on the lateral surfaces of the first spacer; and deep high-concentration ion implantation is performed by implanting ions into the active pattern using the first and second spacers and the gate electrode as ion-implantation masks. In one embodiment, forming the active pattern comprises: preparing a silicon-on-insulator (SOI) wafer; and forming the active pattern by patterning a silicon layer of the SOI wafer.

In one embodiment, forming the active pattern includes forming a plurality of active patterns on the substrate, the active patterns having two or more surfaces on which the channel regions are to be formed.

According to another aspect of the present invention, there is provided a multi-gate transistor including an active pattern formed on a substrate, the active pattern having two or more surfaces on which channel regions are to be formed, a gate insulating layer formed on the active pattern, a patterned gate electrode formed on the gate insulating layer and having a shape conformal to the active pattern, and a source/drain region formed in the active pattern located in both lateral surfaces of the gate electrode.

In one embodiment, the height of the gate electrode is in a range of 500-1,000 Å.

In one embodiment, a first spacer is formed on the lateral surfaces of the gate electrode conformally to the active pattern. The first spacer can be formed of a material selected from the group consisting of $SiO_2$, SiN, SiON, and a combination thereof. The first spacer can have a thickness in a range of 100-200 Å. In one embodiment, a second spacer is formed on the lateral surface of the first spacer conformally to the active pattern. In one embodiment, the source/drain region comprises a lightly doped drain region aligned with the gate electrode and the first spacer and a heavily doped region aligned with the second spacer.

In one embodiment, the active pattern is a patterned silicon layer of an SOI wafer.

In one embodiment, the active pattern includes a plurality of active patterns having two or more surfaces on which channel regions are to be formed.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity. In addition, when a layer is described to be formed on another layer or on a substrate, the layer may be formed on the other layer or on the substrate, or a third layer may be interposed between the layer and the other layer or the substrate.

DETAILED DESCRIPTION OF PREFERRED EMBODIMENTS

In embodiments of the present invention, a fabrication method of a multi-gate transistor capable of controlling a gate electrode profile with stable profile reproducibility and a multi-gate transistor fabricated thereby are provided.

According to embodiments of the present invention, an active pattern is formed on a substrate, the active pattern having two or more surfaces on which channel regions are to be formed and a gate insulating layer is formed on the channel regions. A conductive layer for a gate electrode is formed on the gate insulating layer and a sacrificial layer is formed thereon. The sacrificial layer is planarized for performing a photolithography process on the sacrificial layer and the conductive layer for the gate electrode. Preferably, chemical mechanical polishing (CMP) is used to planarize the sacrificial layer and a polishing stop layer functioning as a stop layer against CMP is formed between the conductive layer for the gate electrode and the sacrificial layer. Thus, when the surface planarizing process is performed for forming the gate electrode, the sacrificial layer is removed in a subsequent process. As a result, the conductive layer having a desired thickness can be formed and a profile of the gate electrode can be reproduced in a stable manner.

Multi-gate transistors to which a method of fabricating an active structure according to the present invention can be applied include a double-gate transistor having channel regions on two surfaces of an active pattern and a tri-gate transistor having channel regions on three surfaces of an active pattern.

These multi-gate transistors of the invention also include transistors used in highly integrated semiconductor memory devices such as a dynamic random access memory (DRAM) device, a static RAM (SRAM) device, a flash memory device, a ferroelectric RAM (FRAM) device, a magnetic RAM (MRAM) device, and a parameter RAM (PRAM) device, micro electro mechanical system (MEMS) devices, optoelectronic devices, display devices, and processors such as a central processing unit (CPU) and a digital signal processor (DSP). In particular, embodiments of the present invention can be effectively used to fabricate an active structure of a transistor for a logic device or an SRAM device requiring a great driving current to ensure fast operation.

Hereinafter, preferred embodiments of the present invention will be described in detail with reference to FIGS. 1A through 3J.

Figure 1A:
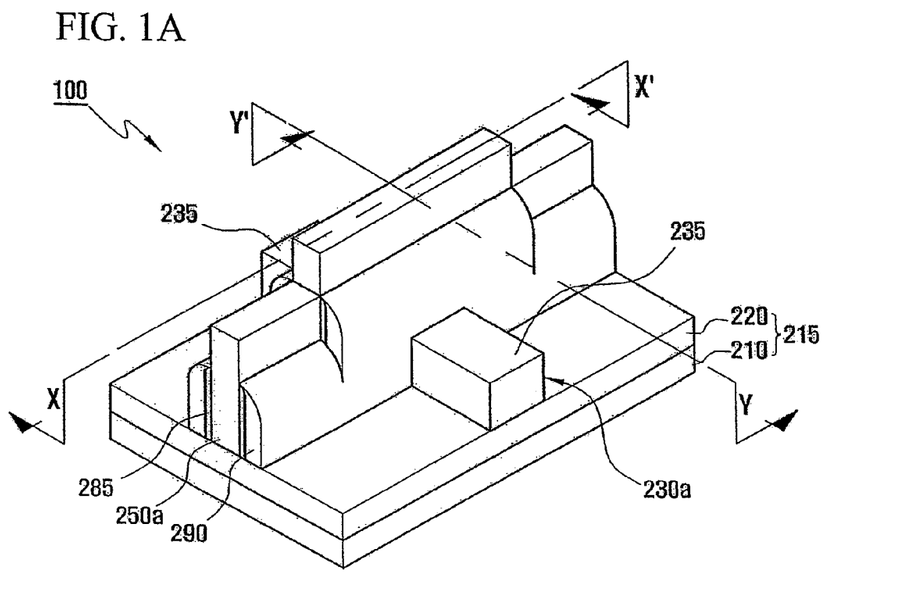
FIG. 1A is a perspective view showing a structure of a multi-gate transistor according to one embodiment of the present invention.
Figure 1B:
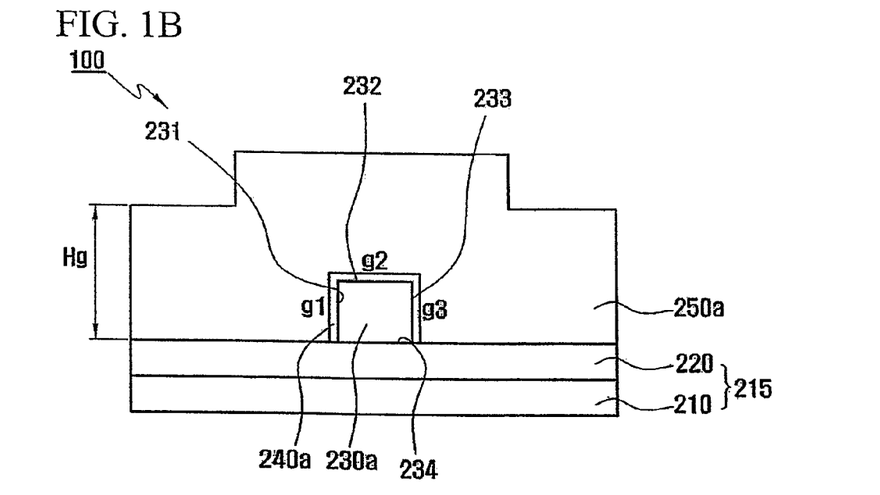
FIG. 1B is a cross-sectional view taken along a line X-X' shown in FIG. 1A.
Figure 1C:
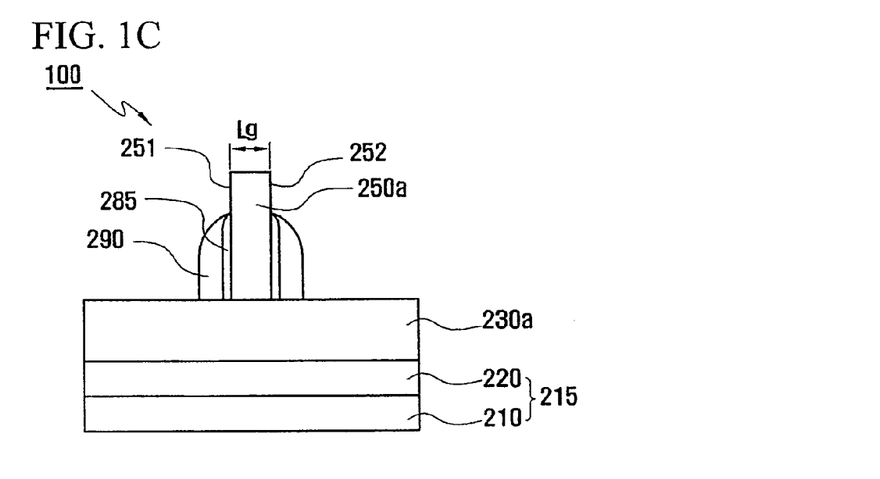
FIG. 1C is a cross-sectional view taken along a line Y-Y' shown in FIG. 1A.

FIG. 1A is a perspective view showing a structure of a multi-gate transistor 100 according to one embodiment of the present invention, FIG. 1B is a cross-sectional view taken along a line X-X' in FIG. 1A, and FIG. 1C is a cross-sectional view taken along a line Y-Y' in FIG. 1A.

As shown, the multi-gate transistor 100 according to the present invention includes an active pattern 230a formed on a substrate 215, the active pattern 230a having two or more surfaces on which channel regions are to be formed, a gate insulating layer 240a formed on the active pattern 230a, a gate electrode 250a formed conformally on the gate insulating layer 240a according to a shape of the active pattern 230a, and a source/drain region 235 formed on the active patterns located in both lateral surfaces of the gate electrode 250a.

In the following specification, description will be given of the invention with reference to the multi-gate transistor 100 having a tri-gate transistor having channel regions formed on three surfaces of the active pattern 230a. It will be understood that the invention is applicable to other multi-gate transistor structures.

The substrate 215 may include a bulk semiconductor substrate 210 and an insulating layer 220 stacked on the semiconductor substrate 210. The active pattern 230a may be a silicon-on-insulator (SOI). Thus, the active pattern 230a is preferably an SOI layer stacked on the insulating layer 220 formed on the bulk semiconductor substrate 210 in order to enhance a drain induced barrier lowering (DIBL) effect in a tri-gate transistor. The SOI substrate may be formed using a bonding process or a Separation by IMplantation of OXygen (SIMOX) process. The bulk semiconductor substrate 210 may be formed of only silicon or silicon and germanium. In addition, a GaAs substrate may also be used as the bulk semiconductor substrate 210 and the invention is not limited thereto. Nitride, oxide or sapphire may be used as the insulating layer 220. Although the substrate 215 using a silicon-on-insulator (SOI) substrate has been described by way of example, the present invention is not limited thereto and the substrate 215 can also be embodied as a general semiconductor substrate.

The active pattern 230a may be formed of a semiconductor material. For example, the active pattern 230a may be formed of silicon (Si), germanium (Ge), silicon germanium ($Si_xGe_y$), gallium arsenic (GaAs), InSb, GaP and carbon nanotube, and the present invention is not limited thereto. In order to improve an electrical characteristic of the multi-gate transistor 100, it is preferable that an ideal single crystalline film be used as the active pattern 230a. In this case, the multi-gate transistor 100 can be used in a high-speed operation device such as a microprocessor. Here, if a device is not required to meet strict specification requirements, like a liquid crystal display (LCD), a polycrystalline film can be used as the active pattern 230a.

As shown in FIGS. 1A and 1B, the active pattern 230a according to the present invention has a lower surface 234 formed at a portion contacting the substrate 215, a pair of lateral surfaces 231 and 233 formed at opposite sides of the lower surface 234, and an upper surface 232 opposite to and facing the lower surface 234. Channel regions are formed on at least two among three surfaces including the lower surface 234 and the lateral surfaces 231 and 233 of the active pattern 230a.

In the multi-gate transistor 100 according to the present invention, as shown in FIG. 1B, the gate insulating layer 240a is formed on three surfaces of the active pattern 230a. That is, the gate insulating layer 240a is formed on the upper surface 232 and lateral surfaces 231 and 233 of the active pattern 230a, on which the channel regions are to be formed.

The gate insulating layer 240a may be formed using an oxide layer, a thermally grown silicon dioxide layer, silk, polyimide, or a high dielectric material. Here, the oxide layer may be formed using dry etch using $O_2$ gas at a temperature of 1000-1100° C., wet etch in an atmosphere of water vapor at a temperature of 1000-1100° C., HCl oxidation using a mixture gas of $O_2$ gas and HCl gas, oxidation using a mixture gas of $O_2$ gas and $C_2H_3Cl_3$ gas, oxidation using a mixture gas of $O_2$ gas and $C_2H_2Cl_2$ gas, or the like. The high dielectric material may be formed by forming an $Al_2O_3$ layer, a $Ta_2O_5$ layer, a $HfO_2$ layer, a $ZrO_2$ layer, a hafnium silicate layer, a zirconium silicate layer, or a combination thereof using atomic layer deposition.

Preferably, the gate insulating layer 240a is formed to a thickness of 5-50 Å. As the thickness of the gate insulating layer 240a is reduced, a material having a higher dielectric constant (k) is required, for example, $HfO_2$, $Ta_2O_5$, $Al_2O_3$, PZT, or the like.

As shown in FIGS. 1A through 1C, the gate electrode 250a is formed on the gate insulating layer 240a. It is preferable that the gate electrode 250a is formed on the gate insulating layer 240a formed on three surfaces of the active pattern 230a. The gate electrode conducting layer 250a may be formed by using only a doped polysilicon layer or a metal layer, by sequentially stacking a doped polysilicon layer and a metal layer, or by sequentially stacking a doped polysilicon layer and a metal silicide layer. The metal layer is formed of a tungsten layer, a cobalt layer, or a nickel layer. Suitable examples of the metal silicide layer include a tungsten silicide layer, a cobalt silicide layer, and a nickel silicide layer. The doped polysilicon layer that is widely used at present is formed by LPCVD using $SiH_2Cl_2$ and $PH_3$ gas. The gate electrode 250a is conformally formed along a step of the active pattern 230a.

As shown in FIG. 1B, three channels and three gates g1, g2 and g3 are formed by the gate insulating layer 240a surrounding the upper surface 232 and the lateral surfaces 231 and 233 of the active pattern 230a and the gate electrode 250a formed on the gate insulating layer 240a. Three channels are formed on the upper surface 232 and the lateral surfaces 231 and 233 of the active pattern 230a. The gate width of the multi-gate transistor 100 is equal to the sum of the widths of three channels. That is, the gate width of the multi-gate transistor 100 is equal to the sum of the heights of both lateral surfaces 231 and 233 and the width of the upper surface 232 of the active pattern 230a.

Figure 2:
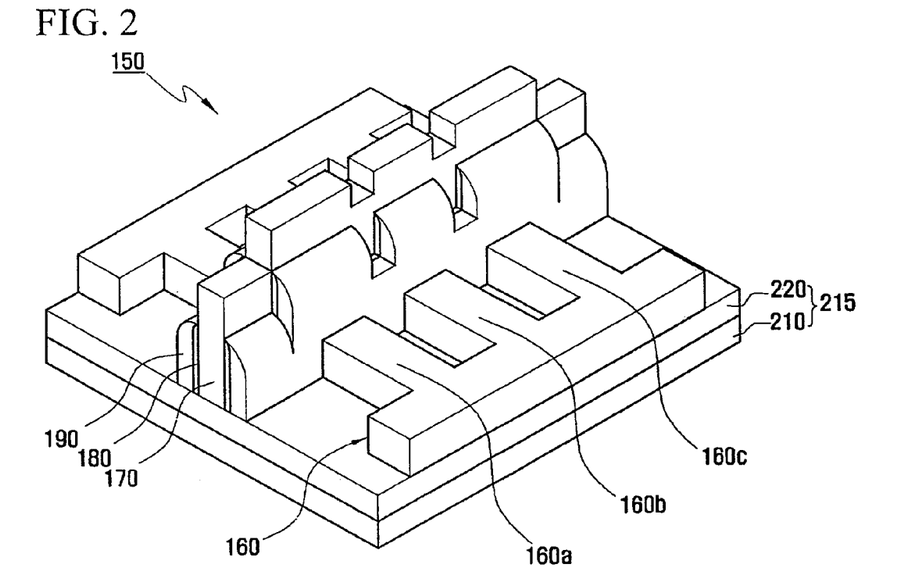
FIG. 2 is a perspective view showing a structure of a multi-gate transistor according to another embodiment of the present invention.

FIG. 2 is a perspective view showing a structure of a multi-gate transistor according to another embodiment of the present invention. As shown in FIG. 2, the gate width of a multi-gate transistor 150 can be increased by forming a single gate electrode 170 on a plurality of active patterns 160a, 160b and 160c. In FIG. 2, reference numeral 160 denotes a source/drain region to which the plurality of active patterns 160a, 160b and 160c are connected. As shown in FIG. 2, the gate electrode 170 of the multi-gate transistor 150 is conformally formed along steps of the plurality of underlying active patterns 160a, 160b and 160c. Further, a first spacer 180 and a second spacer 190 formed in a side of the gate electrode 170 are conformally formed along the steps of the plurality of underlying active patterns 160a, 160b and 160c.

Here, the gate electrode 170 shown in FIG. 2 performs the same function as the above-described gate electrode 250a of FIGS. 1A through 1C and can be fabricated by the same fabrication method as the gate electrode 250a. In addition, the first spacer 180 and the second spacer 190 shown in FIG. 2 may perform the same functions as a first spacer 285 and second spacer 290 of FIGS. 1A through 1C and can be fabricated by the same fabrication method as the first spacer 285 and the second spacer 290, respectively, which will be described below.

As shown in FIG. 1B, in the multi-gate transistor 100 according to the present invention, the upper surface 232 and the lateral surfaces 231 and 233 of the active pattern 230a can be formed to a thickness of 500 Å or less. Preferably, the upper surface 232 of the active pattern 230a is formed to a width of about 400 Å and the lateral surfaces 231 and 233 of the active pattern 230a are formed to a length of about 350 Å.

It is preferable that a height Hg of the gate electrode 250a shown in FIG. 1B is larger than the lengths of the lateral surfaces 231 and 233 of the active pattern 230a. Preferably, the height Hg of the gate electrode 250a is in a range of 500-1,000 Å. More preferably, the height Hg of the gate electrode 250a is in a range of 750-850 Å.

As shown in FIG. 1C, the gate length of the multi-gate transistor 100 according to the present invention corresponds to a distance Lg between lateral surfaces 251 and 252 of the gate electrode 250a. It is preferable that the gate length Lg is formed to a thickness of 600 Å or less. Referring to FIGS. 1A through 1C, it is preferable that the lateral surfaces 251 and 252 of the gate electrode 250a and the lateral surfaces 231 and 233 of the active pattern 230a are formed in a perpendicular direction.

Referring back to FIG. 1A, in the multi-gate transistor 100 according to the present invention, the source/drain region 235 is formed on the active pattern 230a located at either side of the gate electrode 250a. The source/drain region 235 can be doped with either n-type or p-type dopant impurities. The source/drain region 235 according to the present invention may include a lightly doped drain (LDD) region based on shallow ion implantation and a heavily doped region based on deep ion implantation.

The LDD region is formed by implanting ions in the vicinity of the active pattern 230a in a low concentration using the gate electrode 250a as an ion-implantation mask. According to another embodiment of the present invention, as shown in FIG. 1C, in order to ensure the effective channel length during formation of the LDD region, the LDD region is aligned with the first spacer 285 by performing ion implantation using the gate electrode 250a and the first spacer 285 formed on the lateral surface of the gate electrode 250a as ion-implantation masks. Generally, in a case of an n-type transistor, low energy implantation is performed on arsenic (As) or phosphorus (P) having a concentration of about $10^{13}$ atoms/cm$^2$. Further, in a case of a p-type transistor, low energy implantation is performed on boron (B) having a concentration of about $10^{13}$ atoms/cm$^2$. The thus formed LDD region lowers an electric field, thereby preventing a hot carrier effect.

Here, the first spacer 285 used as a mask for low-concentration shallow ion implantation may be not only a single layer, such as an SiO$_2$ layer, but also a multi-layered thin film in which an SiN layer and an SiO$_2$ layer are stacked. Further, the first spacer 285 can be formed to a thickness in a range of 100-200 Å.

As described above, the first spacer 285 is formed on the lateral surface of the gate electrode 250a, thereby ensuring the effective channel length in a subsequent process for forming the LDD region and preventing the gate electrode 250a from being etched away in a subsequent wet etching process.

As shown in FIG. 1A, deep ion implantation is performed on the active pattern 230a using the first spacer 285, the second spacer 290 and the gate electrode 250a formed on the lateral surface of the gate electrode 250a as ion-implantation masks, thereby forming the heavily doped region in an aligned manner with respect to the second spacer 290. Generally, in a case of an n-type metal-oxide semiconductor (MOS) transistor, high-concentration ion implantation is performed on arsenic (As) or phosphorus (P) having a concentration of about $10^{14}$-$10^{15}$ atoms/cm$^2$ at an implant energy of several tens of kiloelectron volts (keV). Further, in a case of a p-type MOS transistor, high-concentration ion implantation is performed on boron (B) having a concentration of about $10^{14}$-$10^{15}$ atoms/cm$^2$ at an implant energy of several tens of kiloelectron volts (keV).

Here, the second spacer 290 used as the mask for deep ion-implantation is made of an insulating material and is formed on the lateral surface of the gate electrode 250a. The second spacer 290 according to the present invention may be formed of SiN, SiO$_2$, SiON, or a combination thereof. The second spacer 290 preferably has a thickness in a range of 20-2,000 Å.

Hereinafter, the method of fabricating the multi-gate transistor 100 according to the present invention will be described with reference to FIGS. 3A through 3J.

Figure 3A:
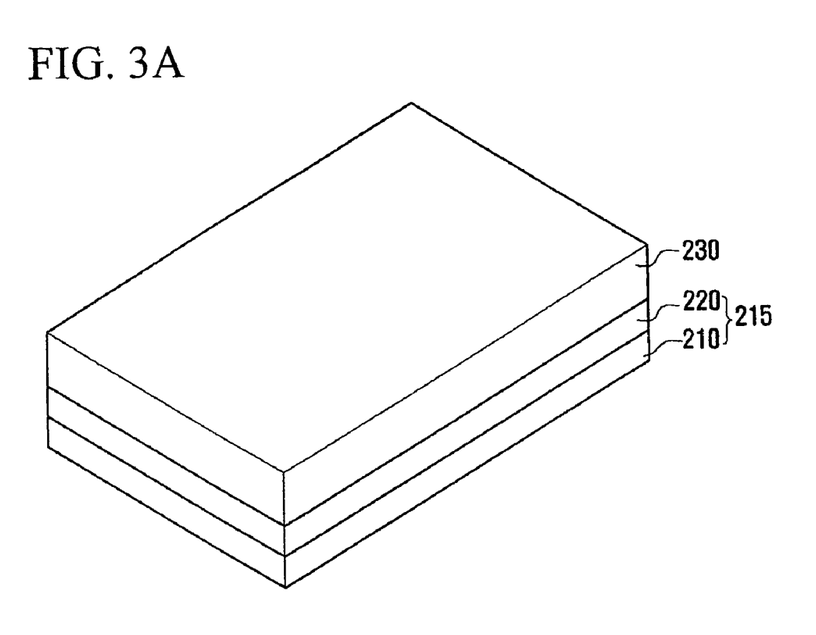
FIGS. 3A through 3J are cross-sectional views successively illustrating steps of a method of fabricating a multi-gate transistor according to the present invention.

As shown in FIG. 3A, the substrate 215 on which an active layer 230 is formed is prepared. Here, the substrate 215 may include a bulk semiconductor substrate 210 and an insulating layer 220 formed on the semiconductor substrate 210, and SOI can be used as the active pattern 230a.

Figure 3B:
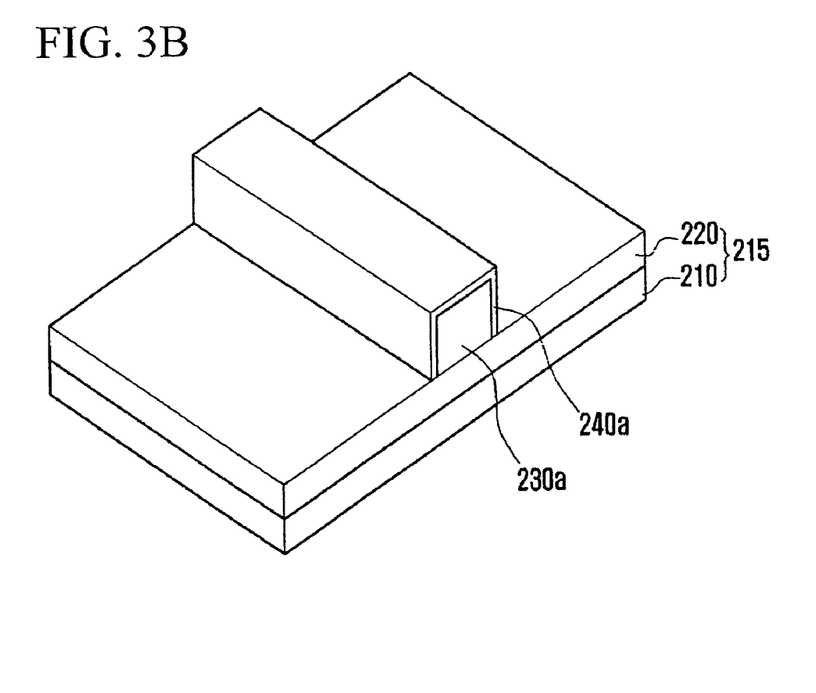

As shown in FIG. 3B, the active layer 230 is patterned to form the active pattern 230a. Here, the active pattern 230a is formed through the following processes. First, an insulating layer for a hard mask is deposited on the active layer 230 and the insulating layer for the hard mask is etched and patterned using photoresist. The active layer 230 is etched using the insulating layer for the hard mask as an etch mask, thereby forming the active pattern 230a. Thereafter, the remaining insulating layer for the hard mask can be removed by wet etching. Alternatively, the active pattern 230a may be formed by performing dry etching the active layer 230 after the photoresist is directly coated on the active layer 230 without using the insulating layer for the hard mask to perform a photolithography process. Thereafter, the remaining photoresist can be removed by ashing and stripping processes.

In addition, ion implantation for adjusting a threshold voltage may be performed on the entire surface of the resulting structure having the active pattern 230a.

Then, as shown in FIG. 3B, the gate insulating layer 240a is formed on the upper surface 232 and both lateral surfaces 231 and 233 (see FIG. 1B) of the active pattern 230a. The gate insulating layer 240a according to the present invention can be formed to a thickness of 5-50 Å by wet oxidation, dry oxidation, CVD, or the like.

Figure 3C:
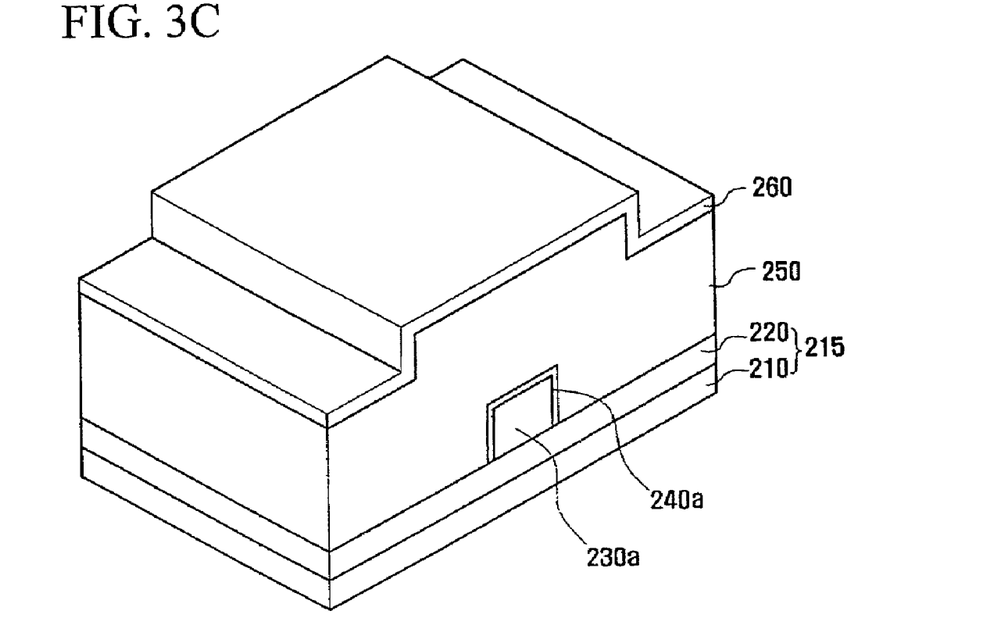

As shown in FIG. 3C, a conductive layer 250 for a gate electrode is formed on the entire surface of the resulting structure having the gate insulating layer 240a. The conductive layer 250 according to the present invention can be formed using a chemical vapor deposition (CVD), such as low-pressure CVD (LPCVD), atmospheric pressure CVD (APCVD), or plasma enhanced CVD (PECVD). Thus, the conductive layer 250 is conformally formed according to the shape or step of the underlying active pattern 230a.

A polishing stop layer 260 is formed on the conductive layer 250. If needed, ion implantation for doping can be performed on the conductive layer 250. A thermal process can be performed for the purpose of activating doped ions.

Here, a material such as SiO$_2$, SiN, SiON, or a combination thereof can be used as the polishing stop layer 260. The polishing stop layer 260 can be formed to a thickness of about 50-2,000 Å using such a method as CVD or atomic layer deposition (ALD). The polishing stop layer 260 can function not only as a stop layer for a subsequent CMP process (hereinafter, referred to as a CMP stopper), but also as a buffer layer for preventing the conductive layer 250 from being damaged during the ion-implantation process. Thus, it is preferable that the polishing stop layer 260 be formed to a thickness of 300 Å or more to be used as the CMP stopper. Under a working environment in which a buffer layer for ion-implantation for doping the conductive layer 250 with doped ions is not required, ion implantation for doping is first performed on the conductive layer 250, followed by activating the doped ions, and the polishing stop layer 260 is then formed on the conductive layer 250.

Figure 3D:
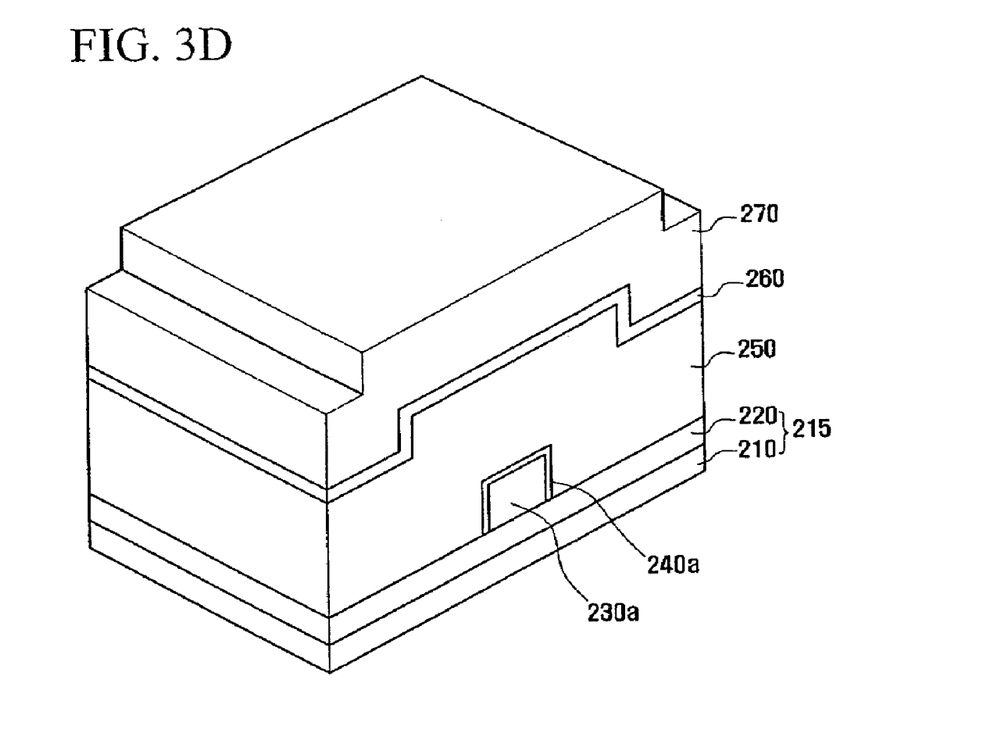

As shown in FIG. 3D, a sacrificial layer 270 is formed on the polishing stop layer 260. Here, amorphous silicon or polycrystalline silicon can be used as the sacrificial layer 270, the amorphous silicon or polycrystalline silicon exhibiting high wet etch selectivity with respect to the active pattern 230*a* made of single crystalline silicon in a subsequent process. Preferably, amorphous silicon exhibiting high wet etch selectivity with respect to the gate electrode 250*a* made of polycrystalline silicon in a subsequent process is used as the sacrificial layer 270. The sacrificial layer 270 can be formed to a thickness of about 200-5,000 Å by CVD or ALD.

Figure 3E:
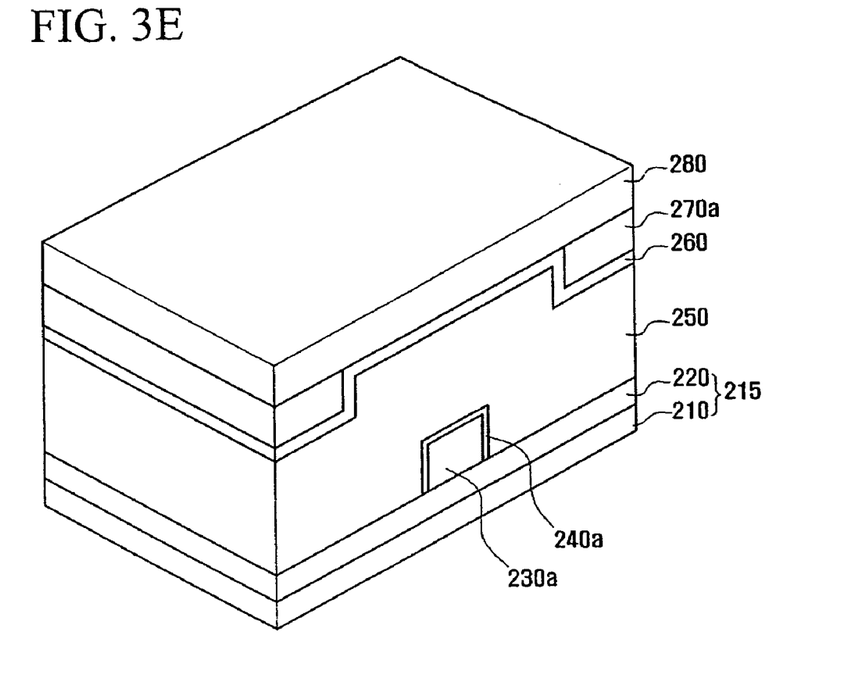

Referring to FIG. 3E, a planarized sacrificial layer 270*a* is formed by polishing the sacrificial layer 270 by CMP. Here, the polishing stop layer 260 can be used as the CMP stopper. Thus, to attain the planarized sacrificial layer 270*a*, CMP is preferably performed until the polishing stop layer 260 is exposed outside. During the CMP, slurry whose etch selectivity ratio of the sacrificial layer 270*a* to the polishing stop layer 260 is 10:1 or higher is preferably used.

An insulating layer 280 is formed on the planarized sacrificial layer 270*a* thus and the polishing stop layer 260. Here, as the insulating layer 280, $SiO_2$, SiN, SiON or a material consisting of a combination thereof having a high etch selectivity with respect to the gate insulating layer 240*a* and the conductive layer 250 for the gate electrode in a subsequent etching process can be used. The insulating layer 280 can be formed to a thickness of about 200-2,000 Å by CVD or ALD.

Figure 3F:
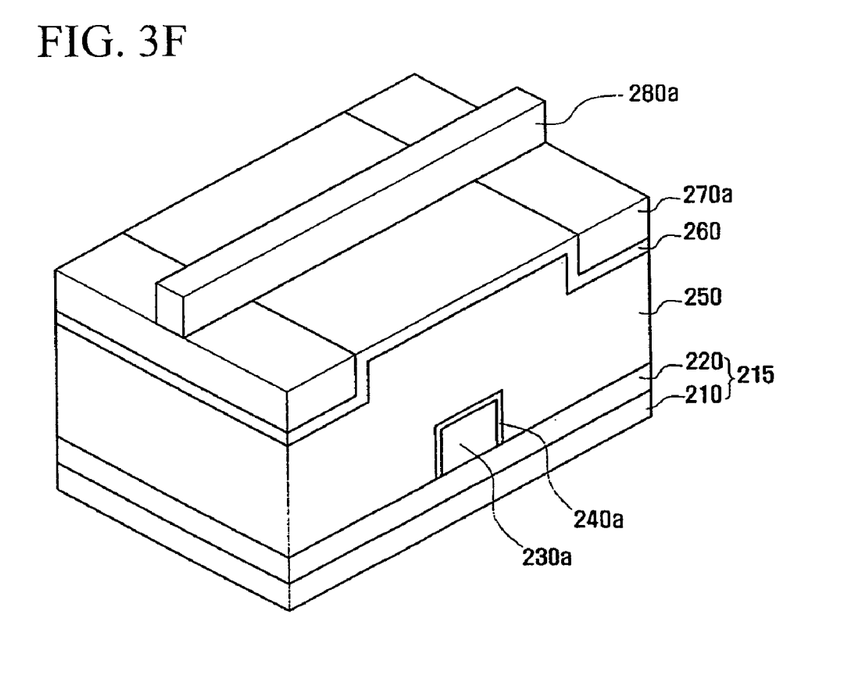

Referring to FIG. 3F, the insulating layer 280 is patterned by an etching process using photoresist so that a patterned insulating layer 280*a* is formed. The remaining photoresist pattern can be removed by ashing and stripping processes. Here, the patterned insulating layer 280*a* is used as a hard mask for forming the gate electrode (250*a* shown in FIG. 3G), which will later be described. As shown in FIG. 3F, it is preferable that the patterned insulating layer 280*a* and the active pattern 230*a* be formed in a perpendicular direction with respect to each other.

Figure 3G:
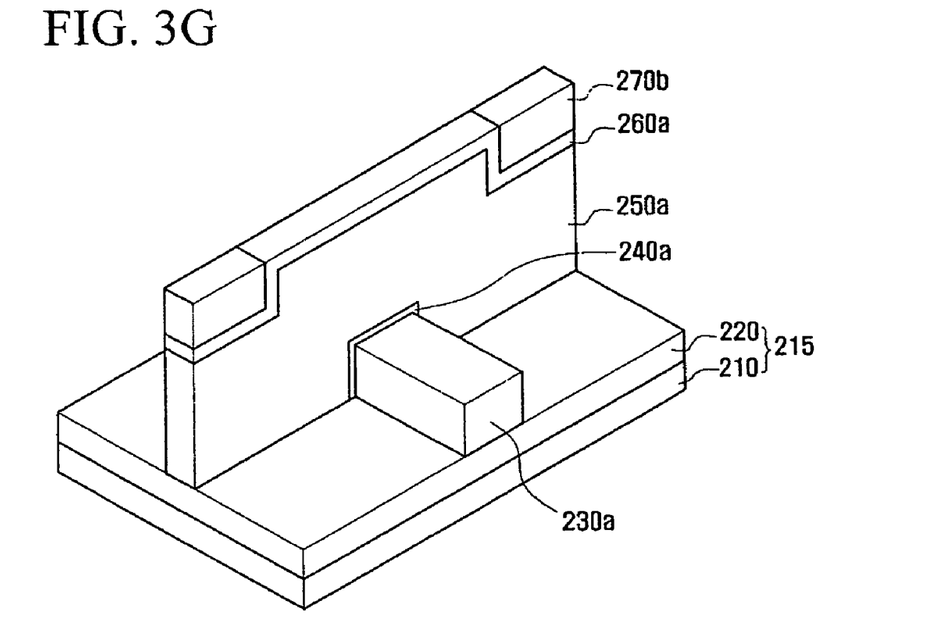

As shown in FIG. 3G, the polishing stop layer 260, the sacrificial layer 270*a* and the conductive layer 250 for a gate electrode 250*a* are etched using the patterned insulating layer 280*a* as a hard mask, thereby forming the gate electrode 250*a*. Here, a highly selective etching process is preferably employed for the purpose of allowing the patterned insulating layer 280*a* to be less etched than a polishing stop layer 260*a* and a sacrificial layer 270*b* during the etching process. The polishing stop layer 260*a* and the sacrificial layer 270*b* are resultant layers after the polishing stop layer 260 and the sacrificial layer 270*a* undergo the etching process. The remaining patterned insulating layer 280*a* used as the hard mask may be removed by wet etching.

As described above, in order to form the gate electrode 250*a* by patterning the conductive layer 250 for the gate electrode, a photolithography process for pattern formation is necessarily performed. In addition, in order to perform the photolithography process, the surface of the gate electrode 250*a* must be planarized. In the process for fabricating the gate electrode 250*a* according to the present invention, the surface of the gate electrode 250*a* is not directly planarized but is planarized using the sacrificial 270*a* formed on the gate electrode 250*a*, followed by performing the photolithography process. Since the gate electrode 250*a* conformally formed along the steps of the active pattern 230*a* is not etched in a perpendicular direction, an initial shape of the gate electrode as deposited for the first time by a manufacturer can be maintained. That is to say, since a profile of the gate electrode 250*a* can be controlled by the manufacturer, the profile of the gate electrode 250*a*, which greatly affects electrical characteristics of a transistor is reproducible in a stable manner.

Figure 3H:
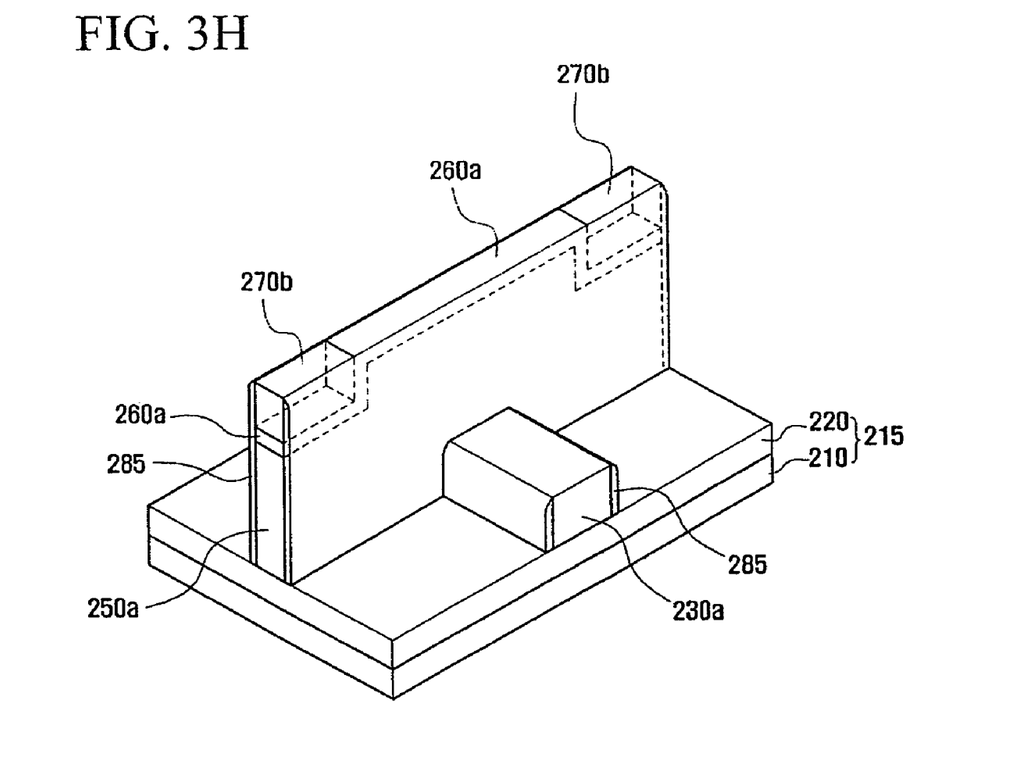

As shown in FIG. 3H, the first spacer 285 can be formed on the lateral surface of the gate electrode 250*a*. The first spacer 285 prevents the gate electrode 250*a* from being etched in a subsequent wet etching process performed for removal of the sacrificial layer 270*b*. The first spacer 285 can be formed on the lateral surfaces of the gate electrode 250*a* and the sacrificial layer 270*b* by performing etch back after coating an insulating layer on the entire surface of the resulting structure shown in FIG. 3G by CVD, for example. The first spacer 285 formed on regions other than the lateral surface of the gate electrode 250*a* can be removed in subsequent steps of removing and cleaning the sacrificial layer 270*b*.

According to the illustrative embodiment of the present invention, since the first spacer 285 is formed on the lateral surface of the gate electrode 250*a*, the first spacer 285 prevents the gate electrode 250*a* from being etched and ensures an effective channel length in a subsequent process for forming the LDD region.

As described above, the first spacer 285 is formed at a predetermined temperature or less to prevent the sacrificial layer 270*b* from undergoing a phase change so that the sacrificial layer 270*b* is changed from an amorphous silicon phase into a polycrystalline silicon phase. If the sacrificial layer 270*b* formed of amorphous silicon is crystallized into polycrystalline silicon in a process for forming the first spacer 285, the gate electrode 250*a* may be etched in the subsequent wet etching process performed for removal of the sacrificial layer 270*b*. Generally, amorphous silicon is crystallized at a temperature of about 600 degrees C. or more to become polycrystalline silicon. Thus, it is preferable that the formation process of the first spacer 285 be performed at a low temperature of 550 degrees C. or less.

According to the present invention, both a single layer such as an $SiO_2$ layer and a multi-layered thin film such as a stack of an SiN layer and an $SiO_2$ layer can be used as the first spacer 285. Further, a material such as $SiO_2$, SiN, SiON, or a combination thereof can also be used as the first spacer 285. The first spacer 285 can be formed to a thickness in a range of 100-200 Å.

Figure 3I:
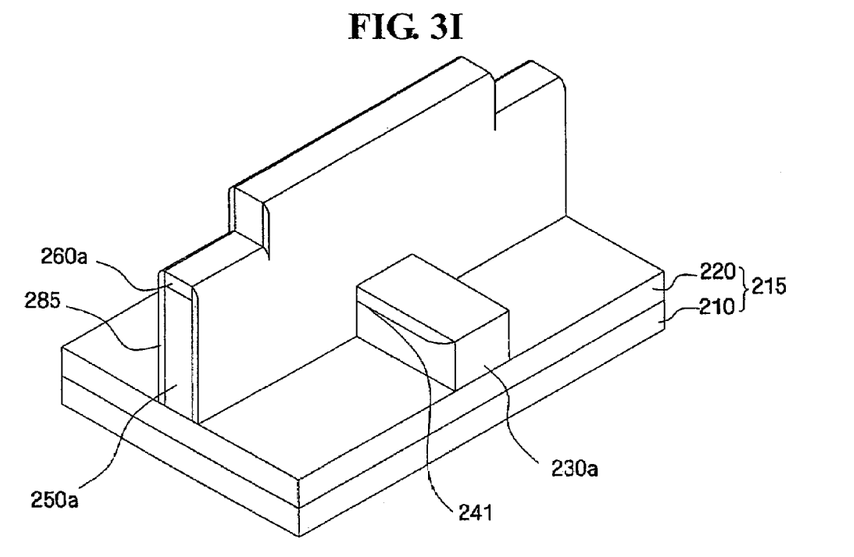

As shown in FIG. 3I, the sacrificial layer 270*b* is removed by wet etching. At this time, the wet etching preferably has high selectivity so that the sacrificial layer 270*b* is etched while the gate electrode 250*a* is not etched. Further, with respect to the active pattern 230*a*, only the sacrificial layer 270*b* is preferably selectively etched. Thus, in the illustrative embodiment of the present invention, when the sacrificial layer 270*b* is removed by wet etching, an etchant having high etching selectivity of the sacrificial layer 270*a* to the active pattern 230*a* formed of single crystalline silicon, that is, greater than 10:1, can be used. Examples of such etchant include a tetramethylammonium hydroxide (TMAH) solution, and a mixed solution containing nitric acid, HF and water mixed in a ratio of 100:40:x (x=1–3).

As shown in FIG. 3I, LDD regions 241 are formed by performing shallow low-concentration ion implantation in the vicinity of the surface of the active pattern 230*a* located at either side of the gate electrode 250*a* from which the sacrificial layer 270*b* has been removed using the gate electrode 250*a* and the first spacer 285 formed on the lateral surface of the gate electrode 250*a* as ion-implantation masks. At this time, generally known deep halo implantation can be performed on the active pattern 230*a* located directly under the gate electrode 250*a*. In addition, after removing the first spacer 285 formed on the surface of the gate electrode 250*a*, the lightly doped drain region 241 can be formed according to the process condition.

Figure 3J:
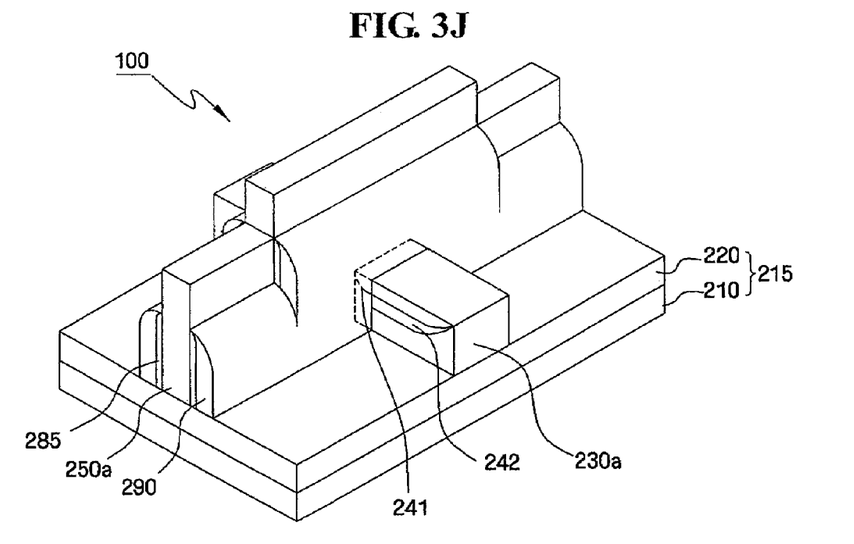

An insulating layer for a spacer is coated on the entire surface of the resulting structure shown in FIG. 3I by CVD or the like, followed by performing an etch-back process. As a result, as shown in FIG. 3J, the second spacer 290 is formed on the lateral surface of the first spacer 285. The polishing stop layer 260*a* shown in FIG. 3I can be removed by dry etching the insulating layer for forming the second spacer 290 and then cleaning the same.

Referring to FIG. 3J, the heavily doped region 242 is formed by performing deep ion implantation on the active pattern 230*a* using the second spacer 290 formed on the lateral surface of the gate electrode 250*a* and the gate electrode 250*a* as ion-implantation masks.

The source/drain region of the multi-gate transistor 100 according to the present invention is defined by the LDD region 241 and the heavily doped region 242 formed within the active pattern 230*a*.

Thereafter, an interlayer dielectric (not shown) is formed and a contact plug (not shown) contacting the source/drain region, another contact plug (not shown) contacting the gate electrode 250*a*, and an upper interconnect (not shown), are formed by general methods, thereby completing the multi-gate transistor according to the present invention.

As described above, according to the present invention, a profile of a gate electrode can be reproduced in a stable manner, thereby providing a multi-gate transistor having improved performance and a fabrication method thereof.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a multi-gate transistor comprising:
    forming an active pattern on a substrate, the active pattern having two or more surfaces on which channel regions are to be formed;
    forming a gate insulating layer on the channel regions;
    forming a conductive layer for a gate electrode on the gate insulating layer conformally to the active pattern;
    forming a sacrificial layer for planarizing an upper surface of the substrate by filling a step of the conformally formed conductive layer for the gate electrode;
    forming the gate electrode by patterning the conductive layer and the sacrificial layer;
    forming a first spacer on the gate electrode and the lateral surfaces of the sacrificial layer remaining on the gate electrode; and
    removing the remaining sacrificial layer after forming the gate electrode,
    wherein in the removing of the sacrificial layer, the first spacer formed on the lateral surface of the sacrificial layer is removed together with the sacrificial layer so that the first spacer remains on the lateral surfaces of the gate electrode.

2. The method of claim 1, wherein forming the sacrificial layer comprises:
    forming the sacrificial layer on the surface of the resulting structure having the conductive layer; and
    filling the step of the conformally formed conductive layer by planarizing the sacrificial layer.

3. The method of claim 2, wherein the sacrificial layer is an amorphous silicon layer.

4. The method of claim 2, wherein planarizing the sacrificial layer includes using a chemical mechanical polishing (CMP) process.

5. The method of claim 4, after forming of the conductive layer, further comprising forming a polishing stop layer on the conductive layer.

6. The method of claim 5, wherein the polishing stop layer is formed of a material selected from the group consisting of $SiO_2$, SiN, SiON, and a combination thereof.

7. The method of claim 1, before the patterning of the conductive layer and the sacrificial layer, further comprising:
    forming an insulating layer on the substrate;
    forming a hard mask by patterning the insulating layer using a pattern for defining the gate electrode; and
    forming the gate electrode by etching the conductive layer and the sacrificial layer using the hard mask as an etch mask.

8. The method of claim 1, wherein the remaining sacrificial layer is removed by a selective wet etching process.

9. The method of claim 8, wherein one of a tetramethylammonium hydroxide (TMAH) solution and a mixed solution of nitric acid, HF and water is used during the selective wet etching process.

10. The method of claim 1, wherein the first spacer is formed at a temperature of 550 degrees C. or less.

11. The method of claim 10, wherein the first spacer is formed of a material selected from the group consisting of $SiO_2$, SiN, SiON, and a combination thereof.

12. The method of claim 1, after removing the sacrificial layer, further comprising:
    performing shallow low-concentration ion implantation by implanting ions into the active pattern using the gate electrode and the first spacer as ion-implantation masks;
    forming a second spacer on the lateral surfaces of the first spacer; and
    performing deep high-concentration ion implantation by implanting ions into the active pattern using the first and second spacers and the gate electrode as ion-implantation masks.

13. The method of claim 1, wherein forming the active pattern comprises:
    preparing a silicon-on-insulator (SOI) wafer; and
    forming the active pattern by patterning a silicon layer of the SOI wafer.

14. The method of claim 1, wherein forming the active pattern includes forming a plurality of active patterns on the substrate, the active patterns having two or more surfaces on which the channel regions are to be formed.

* * * * *